(12) United States Patent
Wada et al.

(10) Patent No.: US 11,615,975 B2
(45) Date of Patent: Mar. 28, 2023

(54) STORAGE SYSTEM

(71) Applicant: Murata Machinery, Ltd., Kyoto (JP)

(72) Inventors: Eiji Wada, Inuyama (JP); Kosuke Irino, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 87 days.

(21) Appl. No.: 17/425,716

(22) PCT Filed: Dec. 13, 2019

(86) PCT No.: PCT/JP2019/048870
§ 371 (c)(1),
(2) Date: Jul. 23, 2021

(87) PCT Pub. No.: WO2020/153039
PCT Pub. Date: Jul. 30, 2020

(65) Prior Publication Data
US 2022/0189807 A1 Jun. 16, 2022

(30) Foreign Application Priority Data
Jan. 25, 2019 (JP) .............................. JP2019-011280

(51) Int. Cl.
*H01L 21/677* (2006.01)
*B65G 1/04* (2006.01)
*B66C 19/00* (2006.01)

(52) U.S. Cl.
CPC ...... *H01L 21/67733* (2013.01); *B65G 1/0428* (2013.01); *B66C 19/00* (2013.01); *H01L 21/6773* (2013.01); *H01L 21/67724* (2013.01)

(58) Field of Classification Search
CPC ............... B65G 1/0457; B65G 1/0428; B65G 2201/0297; B61B 3/02; E04B 9/006;
(Continued)

(56) References Cited

U.S. PATENT DOCUMENTS 9,187,260 B2    11/2015  Ota et al.
9,415,934 B2 *   8/2016  Ikeda ...................... B66C 19/00
(Continued)

FOREIGN PATENT DOCUMENTS

CN    104302562       1/2015
JP    2000-124284 A    4/2000
(Continued)

OTHER PUBLICATIONS

Extended European Search Report dated Sep. 7, 2022, of counterpart European Patent Application No. 19911633.6.
(Continued)

*Primary Examiner* — Glenn F Myers
(74) *Attorney, Agent, or Firm* — DLA Piper LLP (US)

(57) ABSTRACT

A storage system includes an overhead stocker having a first overhead track, a rack including a plurality of storages arranged vertically, and a crane that travels along the first overhead track and delivers and receives an article to and from the storages; and an overhead transport vehicle system having a second overhead track provided below a lower end of the overhead stocker, and an overhead transport vehicle that travels along the second overhead track and delivers and receives an article to and from a predetermined transfer destination, wherein the first overhead track has an elevating track capable of supporting and lowering the crane that is stopped traveling at a portion deviated from the second overhead track in planar view.

5 Claims, 12 Drawing Sheets

(58) Field of Classification Search
CPC ........... H01L 21/67733; H01L 21/6773; H01L 21/67736; H01L 21/67724; H01L 21/67769; H01L 21/67727; B66C 19/00
See application file for complete search history.

(56) References Cited

U.S. PATENT DOCUMENTS

| | | | |
|---|---|---|---|
| 9,548,230 B2* | 1/2017 | Iwasaki | ............... H01L 21/6773 |
| 10,988,359 B2 | 4/2021 | Tanaka | |
| 2008/0014061 A1 | 1/2008 | Izumi | |
| 2012/0118845 A1* | 5/2012 | Wada | .................. H01L 21/6773 212/71 |
| 2015/0110585 A1 | 4/2015 | Ota | |
| 2017/0140966 A1 | 5/2017 | Li et al. | |
| 2017/0200626 A1* | 7/2017 | Takai | ................ H01L 21/67769 |
| 2019/0006217 A1 | 1/2019 | Motoori | |
| 2020/0130931 A1 | 4/2020 | Motoori | |

FOREIGN PATENT DOCUMENTS

| | | |
|---|---|---|
| JP | 2007-331906 A | 12/2007 |
| JP | 5028871 B2 | 9/2012 |
| JP | 2017-30944 A | 2/2017 |
| KR | 20190001107 A | 1/2019 |
| WO | 2012/060291 A1 | 5/2012 |
| WO | 2017/029871 A1 | 2/2017 |
| WO | 2018/074130 A1 | 4/2018 |
| WO | 2019/003753 A1 | 1/2019 |

OTHER PUBLICATIONS

The First Office Action dated Jun. 24, 2022, of counterpart Chinese Patent Application No. 201980089990.1, along with an English translation.

* cited by examiner

STORAGE SYSTEM

TECHNICAL FIELD

This disclosure relates to a storage system.

BACKGROUND

At semiconductor manufacturing plants and the like, articles such as front-opening unified pod (FOUP) that accommodates semiconductor wafers or a reticle pod that contains a reticle are transported by an overhead transport vehicle, and the delivery and reception of articles to and from a transfer destination such as a load port of processing equipment is performed. It has been known that the articles transported by this overhead transport vehicle are stored in a storage system capable of delivering and receiving the articles to and from the overhead transport vehicle (for example, see Japanese Unexamined Patent Application Publication No. 2017-030944). In Japanese Unexamined Patent Application Publication No. 2017-030944, a plurality of storages on which articles are placed are provided vertically, and the articles can be transferred between the storages. It has also been known that, in the transfer of articles in a plurality of storages, a crane that travels along an overhead track and delivers and receives articles to and from the storages can be applied (for example, see International Publication No. 2018/074130).

The crane described in International Publication No. 2018/074130 needs to be carried in and carried out to and from the overhead track in maintenance or the like. For example, when various systems, devices, storages or the like are provided below the overhead track that this crane travels, carrying in and carrying out the crane to and from the overhead track needs to be performed by avoiding the arrangement of those various systems.

It could therefore be helpful to provide a storage system capable of carrying in and carrying out a crane to and from an overhead track reliably and easily.

SUMMARY

We thus provide:
A storage system may include an overhead stocker having a first overhead track, a rack including a plurality of storages arranged vertically, and a crane that travels along the first overhead track and delivers and receives an article to and from the storages; and an overhead transport vehicle system having a second overhead track provided below a lower end of the overhead stocker, and an overhead transport vehicle that travels along the second overhead track and delivers and receives an article to and from a predetermined transfer destination; wherein the first overhead track has an elevating track capable of supporting and lowering the crane that has stopped traveling at a portion deviated from the second overhead track in planar view.

The elevating track may be provided directly above a worker passage. A suspending member that suspends and holds the elevating track and an elevating track driver that raises and lowers the elevating track by winding or feeding out the suspending member may be provided. A transport device that transports an article vertically between the overhead stocker and the overhead transport vehicle system, and a placement portion that is provided directly below the elevating track and allows both the overhead transport vehicle and the transport device to deliver and receive an article may be provided, and the placement portion may be retractable from directly below the elevating track. The placement portion may be arranged to bridge between a pair of other placement portions, and the overhead transport vehicle may be able to deliver and receive an article to and from the other placement portions.

The first overhead track has the elevating track capable of supporting and lowering the crane that has stopped traveling at a portion deviated from the second overhead track in planar view so that carrying out and carrying in of the crane with respect to the first overhead track can be performed reliably and easily without interfering with the overhead transport vehicle system.

In the configuration in which the elevating track is provided directly above the worker passage, as no device or the like is placed in the worker passage normally, the use of this worker passage allows carrying out and carrying in of the crane to be performed easily. In the configuration in which the suspending member that suspends and holds the elevating track and the elevating track driver that raises and lowers the elevating track by winding or feeding out the suspending member are provided, by the suspending member and the elevating track driver, the elevating track can be raised and lowered easily. In the configuration in which the transport device that transports an article vertically between the overhead stocker and the overhead transport vehicle system and the placement portion that is provided directly below the elevating track and allows both the overhead transport vehicle and the transport device to deliver and receive an article are provided and the placement portion is retractable from directly below the elevating track, by retracting the placement portion from directly below the elevating track when lowering the elevating track, the places where the overhead transport vehicle and the transport device deliver and receive an article can be increased while preventing the crane that is carried out and carried in from interfering with the placement portion. In the configuration in which the placement portion is arranged to bridge between a pair of other placement portions and the overhead transport vehicle is able to deliver and receive an article to and from the other placement portions, as there is no suspending member from the ceiling nor supporting member from the floor surface in the placement portion to be retracted, this placement portion can be retracted from directly below the elevating track easily.

DESCRIPTION OF REFERENCE SIGNS

Figure 1:
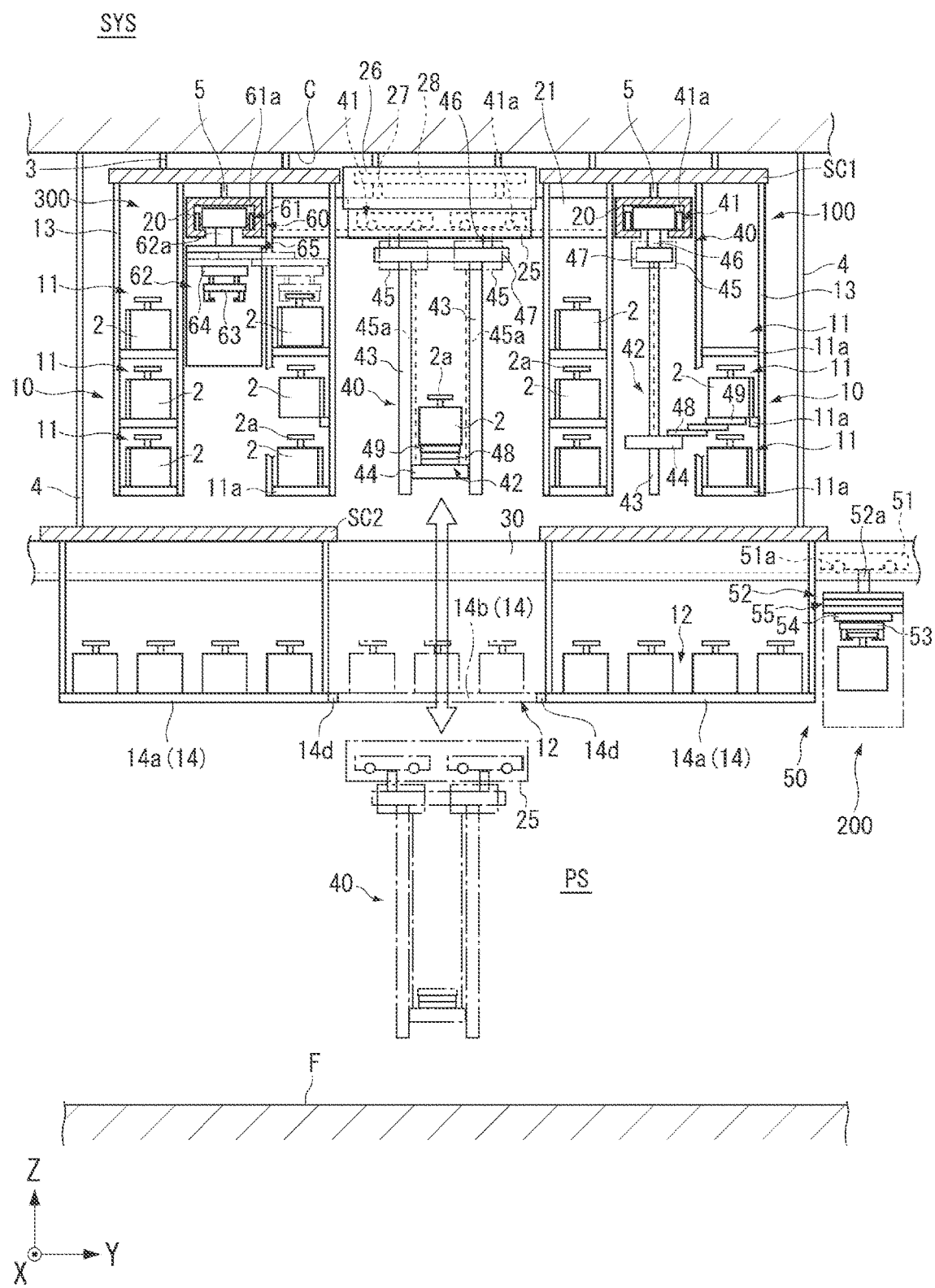
FIG. 1 is a diagram of a storage system according to a first example viewed from the X direction.

C ceiling
F floor surface
LP load port
TL processing apparatus
PS worker passage
SYS, SYS2 storage system
2 article
10 rack
11 storage
12 delivery port
14, 114 placement portion
14a, 114a fixed portion
14b, 114b detachable portion
20 first overhead track
25 elevating track
27 suspending member
28 elevating track driver
30 second overhead track
40 crane
50 overhead transport vehicle
60 upper overhead transport vehicle
70 crane transport carriage
71 transfer track
72 crane accommodating portion
73 wheel
100 overhead stocker
200 overhead transport vehicle system
300 transport device

DETAILED DESCRIPTION

The following describes examples with reference to the accompanying drawings. However, our storage systems are not limited to the examples described in the following. In addition, to explain the examples, the drawings are expressed by changing the scale as appropriate such as drawing a part in an enlarged or emphasized manner. In each of the following drawings, the directions in the drawing will be described using an XYZ coordinate system. In this XYZ coordinate system, the vertical direction is the Z direction, and the horizontal direction is the X direction and the Y direction. The Y direction is one direction within the horizontal direction. The X direction is the direction orthogonal to the Y direction. In each direction of the X, Y, and Z directions, the direction pointed by an arrow is expressed as the + direction (for example, +X direction) and the direction opposite to the direction pointed by the arrow is expressed as the − direction (for example, −X direction), as appropriate.

First Example

Figure 2:
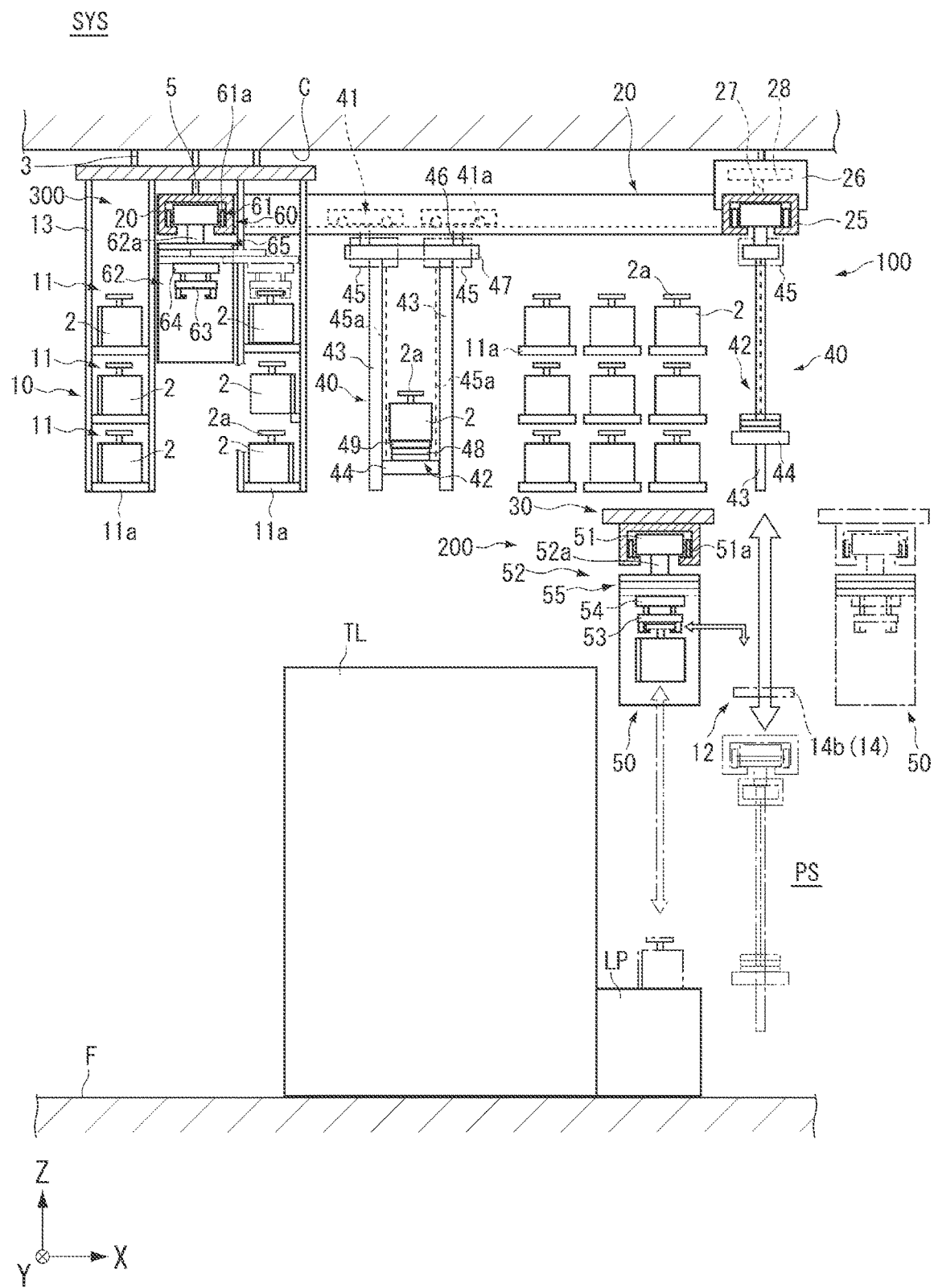
FIG. 2 is a diagram of one example of the storage system illustrated in FIG. 1 viewed from the Y direction.
Figure 3:
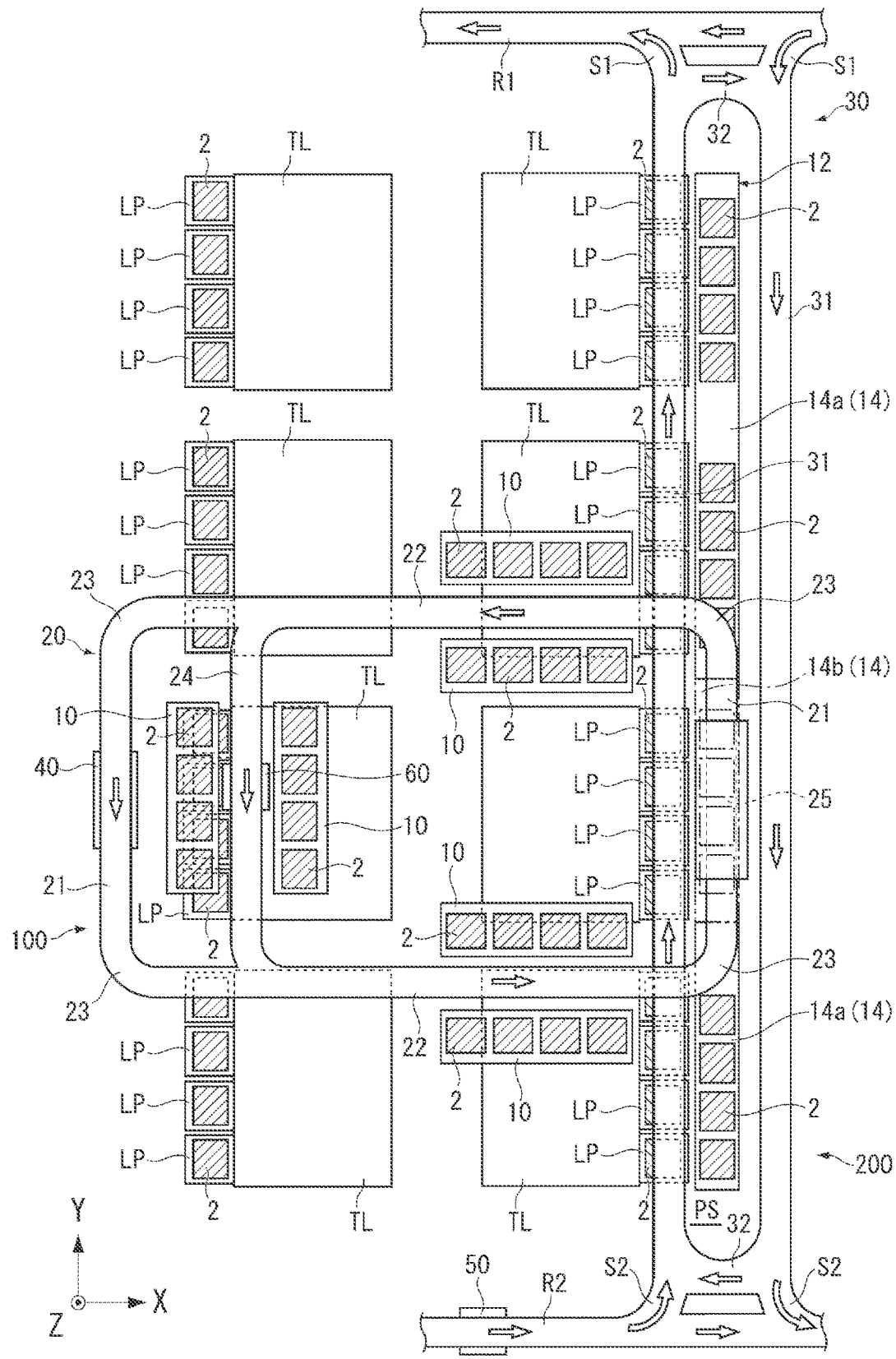
FIG. 3 is a diagram schematically illustrating the storage system illustrated in FIG. 1 in planar view.

FIG. 1 is a diagram of a storage system SYS according to a first example viewed from the X direction. FIG. 2 is a diagram of the storage system SYS viewed from the Y direction. FIG. 3 is a diagram schematically illustrating the storage system SYS in planar view. In FIG. 3, to facilitate making distinctions in the drawing, articles 2 are illustrated by hatching.

The storage system SYS illustrated in FIGS. 1 to 3 is provided, for example, in a semiconductor device manufacturing factory and the like and stores the articles 2 such as FOUPs that accommodate semiconductor wafers used for manufacturing semiconductor devices or reticle pods that contain reticles. An example in which the article 2 is a FOUP will be described, but the article 2 may be other than FOUP. The storage system SYS is also applicable to facilities in fields other than that in the semiconductor manufacturing field, and the article 2 may be other articles that can be stored by the storage system SYS.

The storage system SYS includes, as illustrated in FIGS. 1 to 3, an overhead stocker 100, an overhead transport vehicle system 200, and a transport device 300. The overhead stocker 100 includes racks 10 each having a plurality of storages 11, a first overhead track 20, and a crane 40. The racks 10 are arranged along the first overhead track 20 on which the crane 40 travels (see FIG. 3). In addition, as illustrated in FIG. 1, the storages 11 provided on the rack 10 are provided on a frame 13 and arranged in three stages vertically (Z direction). The number of stages of the storages 11 can be set arbitrarily. In addition, a plurality of storages 11 are arranged in a line along the traveling direction (Y direction) of the crane 40 which will be described later.

The storages 11 have shelves 11a on which the articles 2 are placed. Each shelf 11a is held by the frame 13. Placing the article 2 on the storage 11 means to place the article 2 on the shelf 11a of the storage 11. On each shelf 11a of the storage 11, a plurality of pins that enter groove portions provided on the bottom face of the article 2 when the article 2 is placed may be provided. As the pins enter into the groove portions of the article 2, the article 2 is positioned with respect to the storage 11 (the shelf 11a).

The rack 10 is suspended from a system ceiling SC1 by the frame 13. The system ceiling SC1 is suspended from a ceiling C of the building by hanging fittings 3. The frame 13 may, in place of being suspended from the system ceiling SC1, be suspended directly from the ceiling C. The lower end of the rack 10 is set to be higher than the height of the upper end of a processing apparatus TL from the floor surface F. The processing apparatus TL performs various processes such as a film-forming process or an etching process on a semiconductor wafer accommodated in the FOUP that is the article 2, for example. The height of the lower end of the crane 40 also, which will be described later, is set to be higher than the height of the upper end of the processing apparatus TL. That is to say, the overhead stocker 100 is arranged above the upper end of the processing apparatus TL. The lower end of the crane 40 is set to a height that allows workers or the like to travel on the floor surface F without hindrance. As a result, a portion of the space below the overhead stocker 100 can be used as a worker passage PS.

In the storage 11, by the crane 40, the article 2 is placed, and the article 2 is taken out. In some of the storages 11, by an upper overhead transport vehicle 60 which will be described later, the article 2 is placed, and the article 2 is taken out. The storage 11 to and from which the article 2 is delivered and received by the upper overhead transport vehicle 60 is the storage 11 of the uppermost stage of the rack 10. The vertical dimension of the storage 11 (the size from the upper face of a shelf 11a to the lower face of a shelf 11a of the storage 11 above) is set to a size needed for a transfer device 42 of the crane 40 which will be described later to support and lift the article 2 from the lower face side. The transfer device 42 of the crane 40 employs, for example, a configuration of supporting and lifting the article 2 from the lower face side and thus does not need a large space above the article 2. For example, the vertical dimension of the storage 11 can be set to a size obtained by adding an extent of a few centimeters to the vertical dimension of the article 2.

The first overhead track 20, as illustrated in FIG. 1, is suspended from the system ceiling SC1 by hanging fittings 5. The first overhead track 20 may be suspended directly from the ceiling C, in place of being suspended from the system ceiling SC1. The first overhead track 20, as illustrated in FIG. 1, has a higher height from the floor surface F than that of a second overhead track 30 of the overhead transport vehicle system 200.

The first overhead track 20, as illustrated in FIG. 3, is a circulating track having linear portions 21 and 22 and curved portions 23. The crane 40 can travel around in one direction (for example, a counterclockwise direction in planar view) along the linear portions 21 and 22 and the curved portions 23. The linear portions 21 are arranged along the Y direction in FIG. 3. The linear portions 22 are arranged along the X direction in FIG. 3. The linear portion 21 and the linear portion 22 each extend in directions orthogonal to each other. The curved portion 23 connects the linear portion 21 and the linear portion 22. The first overhead track 20 is, in planar view, provided with a branch portion 24, on the inner side of the first overhead track 20, which is a circulating track. The branch portion 24 connects two linear portions 22.

The above-described racks 10 are provided on the +Y side and the −Y side of the linear portion 22. Also, the racks 10 are provided on the +X side and the −X side of the branch portion 24. These racks 10 are arranged above the processing apparatus TL. Because the second overhead track 30 of the overhead transport vehicle system 200 is not provided above the processing apparatus TL, by arranging the racks 10 in such a dead space, the space in the building can be used effectively.

Figure 4A:
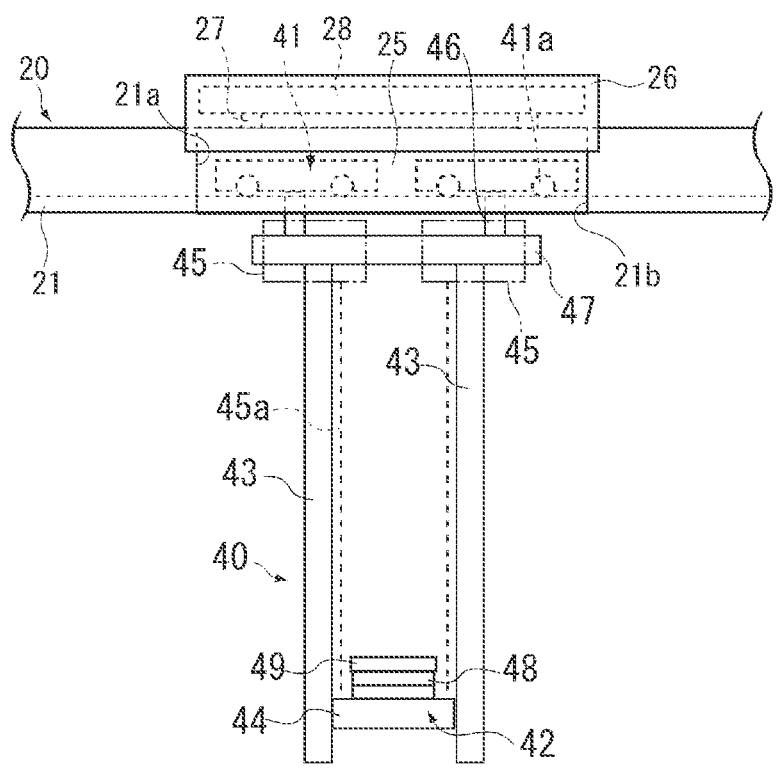
FIGS. 4(A) and 4(B) include one example of the operation of an elevating track, FIG. 4(A) being a diagram illustrating a state before a descent of the elevating track, and FIG. 4(B) being a diagram illustrating a state at the time of the descent of the elevating track.
Figure 4B:
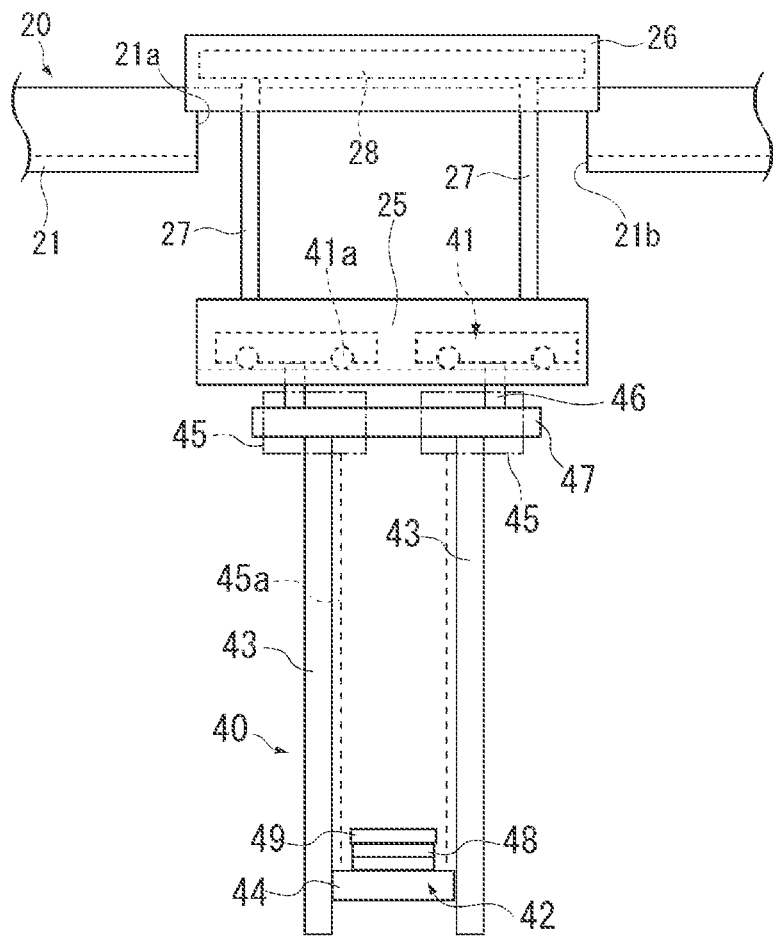

The first overhead track 20 has an elevating track 25 at a portion deviating from the second overhead track 30 in planar view (a position not overlapping with the second overhead track 30). FIGS. 4(A) and 4(B) illustrate one example of the operation of the elevating track, FIG. 4(A) is a diagram illustrating a state before a descent of the elevating track, and FIG. 4(B) is a diagram illustrating a state at the time of the descent of the elevating track. As illustrated in FIGS. 4(A) and 4(B), the linear portion 21 of the first overhead track 20 is cut out at the section corresponding to the elevating track 25, which will be described later. The linear portion 21 includes an end portion 21a and an end portion 21b facing each other at the cutout portion. This cutout portion (the end portion 21a and the end portion 21b) is directly above a placement portion 14 which will be described later (see FIG. 3). The elevating track 25 includes, as illustrated in FIGS. 4(A) and 4(B), a housing portion 26, suspending members 27, and an elevating track driver 28. The housing portion 26 bridges between the end portion 21a and the end portion 21b of the linear portion 21 and is arranged in a state of covering the space between the end portion 21a and the end portion 21b from above. The housing portion 26 is supported on the ceiling C by hanging fittings and the like (see FIG. 1) but may be supported on the system ceiling SC1 or the first overhead track 20.

The housing portion 26 supports the elevating track 25 via the suspending members 27 and the elevating track driver 28. The elevating track 25 is linear and is provided in a part of the linear portion 21 of the first overhead track 20. That is to say, the elevating track 25 is provided as a part of the linear portion 21 constituting the first overhead track 20, which is a circulating track. The elevating track 25 is arranged between the end portion 21a and the end portion 21b when elevated most and is connected to both the end portion 21a and the end portion 21b. The elevating track 25 is set so that the size thereof in the linear direction is such that a whole of the two travelers 41 that are provided on the crane 40 falls within the elevating track 25, for example.

The suspending member 27 is a wire, a belt or the like, for example, and suspends and holds the elevating track 25. A plurality of, for example, two, suspending members 27 are arranged side by side in the linear direction of the elevating track 25. The suspending members 27 are wound by the elevating track driver 28 and held. The suspending member 27 has a length that enables lowering of the elevating track 25 to a predetermined height close to the floor surface F when lowered.

The elevating track driver 28 is held in the housing portion 26 and, by winding and feeding out the suspending members 27, raises and lowers the elevating track 25. The elevating track driver 28 has, for example, a drive source not depicted such as a motor device, a rotatable winding shaft not depicted that winds the suspending members 27, and a transmitter not depicted that transmits a driving force of the drive source to the winding shaft. The elevating track driver 28 rotates the winding shaft as the driving force of the drive source is transmitted to the winding shaft to perform winding and feeding of the suspending members 27. The operation of the elevating track driver 28 is controlled by a control device or the like not depicted.

The elevating track 25 can be lowered (can be raised or lowered) while supporting the crane 40 that has stopped traveling. As illustrated in FIG. 3, in planar view, because the elevating track 25 is deviated from the second overhead track 30, by raising and lowering the elevating track 25 in a state in which the crane 40 is stopped at the elevating track 25, the crane 40 can be raised and lowered without interfering with the overhead transport vehicle system 200. The elevating track 25 is arranged directly above the worker passage PS. This worker passage PS is provided to deviate from directly below the second overhead track 30 in planar view. The worker passage PS is an area where various equipment, devices and the like such as the processing apparatus TL and the load port LP of the processing apparatus TL are not provided to allow the workers to travel therethrough. Thus, by temporarily using this worker passage PS at the time of maintenance and the like, the crane 40 can be reliably lowered to the vicinity of the floor surface F. The configuration to raise and lower the elevating track 25 is not limited to the above-described configuration, and any configuration that raises and lowers the elevating track 25 can be applied.

The crane 40, as illustrated in FIGS. 1 and 2, holds the article 2 and travels along the first overhead track 20 to move. The crane 40 transports the article 2 between the storage 11 and another storage 11. The number of cranes 40 arranged in one first overhead track 20 is not limited to one. For example, the cranes 40 of two or more may be arranged in one first overhead track 20. The crane 40, as illustrated in FIGS. 1 and 2, is suspended from the first overhead track 20.

The crane 40 includes two travelers 41 and a transfer device 42. Below the travelers 41, an upper supporter 47 is fitted via attaching portions 46 and, by the upper supporter 47, the two travelers 41 are coupled. Each traveler 41 includes a traveling driver not depicted and a plurality of wheels 41a and travels along the first overhead track 20. The traveling driver not depicted provided on the traveler 41 may be an electric motor that is provided on the traveler 41 and drives the wheels 41a, or may be a linear motor, for example. In the crane 40 of the first example, the two travelers 41 are provided so that the transfer device 42, which is a heavy object itself, and the article 2 can be reliably supported. The crane 40 is not limited to the configuration provided with two travelers 41 and may include one, or three or more travelers 41.

The transfer device 42 includes masts 43, an elevating table 44, lifting drivers 45, a telescopic portion 48, and a placing table 49. The mast 43 extends vertically in a state of being suspended from the upper supporter 47. One mast 43 is provided both at the front and rear in the traveling direction of the traveler 41. The masts 43 are not limited to being a total of two and may be one. The mast 43 is, as in the foregoing, provided so that the height of the lower end of the mast 43 from the floor surface F is higher than the height of the upper end of the processing apparatus TL. For example, the lower end of the mast 43 is the lower end of the crane 40.

The telescopic portion 48 is composed of a plurality of arms that can be expanded and contracted in the direction orthogonal to the traveling direction of the traveler 41. The placing table 49 is provided at the tip of the telescopic portion 48. The placing table 49 is a triangular plate-like member on which the article 2 can be placed. The placing table 49 holds the article 2 placed on the placing table 49 by supporting it from the lower side. On the upper face of the placing table 49, provided are pins that insert into the groove portions provided on the bottom face of the article 2 and position the article 2. On the above-described shelf 11a of the storage 11, provided is a cutout not depicted that allows the placing table 49 to pass therethrough vertically.

The transfer device 42, when receiving the article 2 from the storage 11, locates the placing table 49 below the article 2 by extending the telescopic portion 48 and raises the elevating table 44, thereby scooping up the article 2 with the placing table 49. The transfer device 42 contracts the telescopic portion 48 while the article 2 is still placed on the placing table 49, thereby arranging the placing table 49, on which the article 2 is placed, above the elevating table 44. When delivering the article 2 to the storage 11 by the transfer device 42, it is performed by reversing the above-described operation. The transfer device 42 is not limited to the above-described configuration and may be in other configurations such as a configuration in which a portion of the article 2 (for example, a flange portion 2a provided on the upper portion of FOUP) is held and lifted, for example.

The two lifting drivers 45 are hoists, for example, and raise and lower the elevating table 44 along the masts 43. Each lifting driver 45 includes a suspending member 45a and a driver not depicted. The suspending member 45a is a wire, a belt or the like, for example, and the elevating table 44 is suspended from the upper supporter 47 by this suspending member 45a. The driver not depicted included in the lifting driver 45 is provided on the upper supporter 47, for example, and performs feeding and winding of the suspending member 45a. The elevating table 44 is guided by the masts 43 and descends, when the drivers not depicted included in the lifting drivers 45 feed out the suspending members 45a. The elevating table 44 is guided by the masts 43 and ascends when the drivers not depicted included in the lifting drivers 45 wind the suspending members 45a. The lifting drivers 45 are controlled by a control device or the like not depicted and lower or raise the elevating table 44 at a predetermined speed. The lifting drivers 45 are controlled by the control device or the like and hold the elevating table 44 at a target height.

The lifting drivers 45 are provided on the upper supporter 47. The lifting drivers 45 may, in place of being provided on the upper supporter 47, be provided on the elevating table 44, for example. As a configuration in which the lifting drivers 45 are provided on the elevating table 44, it may be a configuration in which the elevating table 44 is raised and lowered by performing winding or feeding a belt, a wire or the like suspended from the upper supporter 47 by hoists mounted on the elevating table 44, for example. It may be a configuration in which an electric motor and the like that drives pinion gears is mounted on the elevating table 44, racks that mesh with the pinion gears are formed on the masts 43, and by rotating the pinion gears by the electric motor and the like, the elevating table 44 is raised or lowered.

The overhead transport vehicle system 200 includes the second overhead track 30 and an overhead transport vehicle 50. The overhead transport vehicle 50 travels along the second overhead track 30 and performs the delivery and receiving of the article 2 to and from a load port LP of the processing apparatus TL that is a predetermined transfer destination arranged below the second overhead track 30. The second overhead track 30 is, as illustrated in FIG. 1, fitted to the lower face side of a system ceiling SC2. The system ceiling SC2 is suspended from the ceiling C by hanging fittings 4. The second overhead track 30 may, in place of being suspended from the system ceiling SC2, be suspended from the system ceiling SC1, or be suspended directly from the ceiling C.

The second overhead track 30 is, as illustrated in FIG. 3, arranged between an inter-bay route (inter-bay track) R1 and an inter-bay route R2 in planar view. The second overhead track 30 is each provided in the bay (within an intra-bay), and the inter-bay route R1 and the like are provided to connect a plurality of second overhead tracks 30. In the first example, the bay (intra-bay) refers to a range (area) where, in planar view, the load ports LP of a plurality of processing apparatuses TL are provided to face each other and the worker passage PS is provided between the load ports LP facing each other, for example. The second overhead track 30 is connected from the inter-bay route R1 via two branch lines S1 for entry or exit and is connected from the inter-bay route R2 via two branch lines S2 for entry or exit.

The second overhead track 30 has linear portions 31 and connecting portions 32. The overhead transport vehicle 50 travels around in one direction (for example, a clockwise direction in planar view) along the linear portions 31 and the connecting portions 32. The linear portions 31 are arranged in the Y direction along a plurality of load ports LP directly above the load ports LP. The two linear portions 31 are arranged to be in parallel with (parallel to) the linear portion 21 of the first overhead track 20 in planar view. The connecting portions 32 are arranged at both ends of the +Y side and the −Y side by including a curved portion and connect the two linear portions 31 to each other. The second overhead track 30 is arranged below the crane 40 (the masts 43) and the racks 10 of the overhead stocker 100. The overhead transport vehicle 50 traveling along this second overhead track 30 travels below the overhead stocker 100.

The overhead transport vehicle 50 enters the second overhead track 30 via the branch lines S1 and S2 toward the inter-bay routes R1 and R2 or exits to the inter-bay routes R1 and R2 via the branch lines S1 and S2 toward the second overhead track 30. The overhead transport vehicle 50 travels along the second overhead track 30 and transfers, at the linear portion 31, the article 2 between the load port LP of the processing apparatus TL and the placement portion 14 which will be described later.

The linear portions 31 of the second overhead track 30 are provided along and directly above a plurality of load ports LP facing each other with a predetermined interval (the worker passage PS). In the first example, four load ports LP are provided in one processing apparatus TL (see FIG. 3), but this disclosure is not limited to this example. For example, one to three load ports LP may be provided in one processing apparatus TL, or five or more load ports LP may be provided. However, the number of articles 2 that can be placed in the load port LP is predetermined for each processing apparatus TL. The second overhead track 30 is provided directly above the load ports LP, and thus, the overhead transport vehicle 50 that travels the second overhead track 30 stops and, by merely raising and lowering the article 2, performs the delivery and receiving of the article 2 to and from the load port LP, and with respect to the placement portion 14 (the delivery port 12), which will be described later, performs the delivery and receiving of the article 2 by laterally extending (by lateral transfer) a gripper 53.

The overhead transport vehicle 50 has, as illustrated in FIGS. 1 and 2, a traveler 51 and a body 52. The traveler 51 includes a traveling driver not depicted and a plurality of wheels 51a and travels along the second overhead track 30. The traveling driver not depicted provided on the traveler 51 may be an electric motor that is provided on the traveler 51 and drives the wheels 51a, or may be a linear motor, for example.

The body 52 is fitted to the lower portion of the traveler 51 via an attaching portion 52a. The body 52 has the gripper 53 that grips the article 2, a lifting driver 54 that suspends and elevates the gripper 53, and a lateral feeder 55 that moves the lifting driver 54 to the lateral side of the track. The gripper 53 grasps and grips a flange portion 2a of the article 2 from above, thereby suspending and holding the article 2. The gripper 53 is, for example, a chuck having a plurality of claw portions capable of advancing and retreating in the horizontal direction, and by causing the claw portions to enter below the flange portion 2a of the article 2 and by raising the gripper 53, suspends and holds the article 2. The gripper 53 is connected to a suspending member such as a wire or a belt. The gripper 53 is suspended from the lifting driver 54 and is raised and lowered by the lifting driver 54.

The lifting driver 54 is a hoist, for example, and lowers the gripper 53 by feeding out the suspending member and raises the gripper 53 by winding the suspending member. The lifting driver 54 is controlled by the control device or the like not depicted and lowers or raises the gripper 53 at a predetermined speed. The lifting driver 54 is controlled by the control device or the like not depicted and holds the gripper 53 at a target height.

The lateral feeder 55 has movable plates arranged in an overlapping manner vertically, for example. The movable plates are movable to the lateral side of the traveling direction (a direction orthogonal to the traveling direction, lateral direction) of the traveler 51. On the movable plate, the lifting driver 54 is fitted. The body 52 has a guide not depicted to guide the lateral feeder 55, a driver not depicted to drive the lateral feeder 55 and the like. The lateral feeder 55 moves, by a driving force from the driver such as an electric motor, the lifting driver 54 and the gripper 53 between a protruding position and a storage position. The protruding position is a position where the gripper 53 protrudes to the lateral side from the body 52. The storage position is a position where the gripper 53 is stored in the body 52. A rotator to rotate the lifting driver 54 or the gripper 53 around a shaft vertically may be provided.

The overhead transport vehicle 50 raises and lowers the gripper 53 (the article 2) by the lifting driver 54 as in the foregoing, thereby performing the delivery and receiving of the article 2 to and from the load port LP. The overhead transport vehicle 50 can, in a state in which the lifting driver 54 (the gripper 53) is moved to above any of a plurality of placement portions 14 (including the delivery port 12) by the lateral feeder 55, deliver and receive the article 2 to and from the relevant placement portion 14 by raising and lowering the gripper 53 (the article 2) by the lifting driver 54.

The transport device 300 transports the article 2 vertically between the overhead stocker 100 and the overhead transport vehicle system 200. In the first example, the transport device 300 is the upper overhead transport vehicle 60. The storage system SYS includes the delivery port 12 to deliver and receive articles between the overhead transport vehicle system 200 and the transport device 300 (the upper overhead transport vehicle 60). The delivery port 12 is a part of the placement portion 14 on which the article 2 can be placed. On the delivery port 12, a plurality of articles 2 can be placed. The delivery port 12 is arranged below the linear portion 21 of the first overhead track 20 on which the upper overhead transport vehicle 60 travels. The delivery port 12 is arranged in the lateral direction and below with respect to the second overhead track 30. As a result, as in the foregoing, the overhead transport vehicle 50 can deliver and receive the article 2 to and from the delivery port 12 by lateral transfer.

The placement portion 14 is, in planar view, arranged on the inner side of the second overhead track 30 that is a circulating track and is provided linearly along the Y direction. On the placement portion 14, the articles 2 can be placed side by side in one row, for example. The placement portion 14 has fixed portions 14a and a detachable portion 14b that is the delivery port 12. The detachable portion 14b is provided directly below the elevating track 25. The fixed portions 14a are, with respect to the detachable portion 14b (the delivery port 12) that is a part of the placement portion 14, a pair of other placement portions 14. The fixed portion 14a is a plate-like member or two beam-like members and is suspended from the system ceiling SC2, and the articles 2 are placed on the plate-like member or on the two beam-like members. A pair of fixed portions 14a are arranged at a portion located directly below the elevating track 25 with a gap. The size of the gap, that is, the distance between the pair of fixed portions 14a is set to the size that allows the elevating track 25 (and the crane 40) to pass through the gap vertically. The fixed portion 14a has, at the end portions facing across the gap, couplers 14d to couple the detachable portion 14b. The fixed portion 14a is a buffer on which the articles 2 can be placed and the articles 2 can be delivered and received by the overhead transport vehicle 50.

The detachable portion 14b of the placement portion 14 allows both the overhead transport vehicle 50 of the overhead transport vehicle system 200 and the upper overhead transport vehicle 60 that is the transport device 300 to deliver and receive the article 2. This detachable portion 14b is the delivery port 12 to deliver and receive the article 2 between the overhead transport vehicle 50 and the upper overhead transport vehicle 60 (the transport device 300). The detachable portion 14b is, as with the fixed portion 14a, a plate-like member or two beam-like members. The detachable portion 14b is arranged to be bridged between the fixed portions 14a directly below the elevating track 25. The detachable portion 14b is held by coupling end portions on both sides in the longitudinal direction to the respective couplers 14d of the fixed portions 14a on both sides. With this configuration, the detachable portion 14b does not need a suspending member from the ceiling C, the system ceiling SC2 or the like and a supporting member from the floor surface F, and while preventing the suspending member or the like from hindering traveling of the overhead transport vehicle 50 or the upper overhead transport vehicle 60 or elevating of the crane 40 (the elevating track 25), the detachable portion 14b can be easily detached. The detachable portion 14b can be retracted from directly below the elevating track 25 by being removed from the couplers 14d of the fixed portions 14a.

The upper overhead transport vehicle 60 transports the article 2 vertically between the overhead stocker 100 and the delivery port 12 (the detachable portion 14b of the placement portion 14). The upper overhead transport vehicle 60 has a second traveler 61 and a second body 62. The second traveler 61 employs the same configuration as that of the traveler 41 of the crane 40, includes a traveling driver not depicted and a plurality of wheels 61a, and travels along the first overhead track 20. The second body 62 is fitted to the lower portion of the second traveler 61 via an attaching portion 62a. The second body 62 has a second gripper 63 that holds the article 2, a second lifting driver 64 that suspends and elevates the second gripper 63, and a second lateral feeder 65 that moves the second lifting driver 64 to the lateral side of the track.

These second traveler 61, the second body 62, the second gripper 63, the second lifting driver 64, and the second lateral feeder 65 employ the same configurations as those of the above-described traveler 51, the body 52, the gripper 53, the lifting driver 54, and the lateral feeder 55 of the overhead transport vehicle 50. Thus, for the upper overhead transport vehicle 60, the overhead transport vehicle 50 of the overhead transport vehicle system 200 can be applied as-is. The upper overhead transport vehicle 60 travels the first overhead track 20 so that there is no need to provide a separate track, and the manufacturing cost of the storage system SYS can be reduced.

The upper overhead transport vehicle 60 can, by raising and lowering the second gripper 63 (the article 2) by the second lifting driver 64, deliver and receive the article 2 to and from the detachable portion 14b of the placement portion 14 that is the delivery port 12. The upper overhead transport vehicle 60 can, by raising and lowering the second gripper 63 (the article 2) by the second lifting driver 64, in a state in which the second lifting driver 64 is moved above one storage 11 out of the storages 11 by the second lateral feeder 65, deliver and receive the article 2 to and from the storage 11 located below the second lifting driver 64. In the first example, the upper overhead transport vehicle 60 can deliver and receive the article 2 to and from the storage 11 of the uppermost stage of the rack 10. The storage 11 of a delivery/reception target by the upper overhead transport vehicle 60 may be the storage 11 other than that of the uppermost stage. The transport device 300 is not limited to being the upper overhead transport vehicle 60 and may be other devices such as a conveyor device that can transport the article 2 between the storage 11 and the delivery port 12, for example.

As illustrated in FIG. 3, in the first example, a part of the rack 10 and the load port LP of the processing apparatus TL that is a predetermined transfer destination are overlapped in planar view. Accordingly, the racks 10 can be expanded in the horizontal direction up to above the load port LP, and many articles 2 can be stored. The racks 10 can be provided regardless of the arrangement of the second overhead track 30 of the overhead transport vehicle system 200, and thus, the degree of freedom in the arrangement of the racks 10 is high, and the arrangement of the racks 10 having a favorable storage efficiency of the articles 2 can be easily achieved.

The storage system SYS has a control device not depicted. This control device not depicted integrally controls the storage system SYS. The control device not depicted controls operations of the crane 40, the overhead transport vehicle 50, and the upper overhead transport vehicle 60 by wireless or wired communication. The control device not depicted may be divided into a control device to control the crane 40, a control device to control the overhead transport vehicle 50, and a control device to control the upper overhead transport vehicle 60.

When transporting the article 2 from the storage 11 to the load port LP in the storage system SYS, the control device not depicted controls the upper overhead transport vehicle 60 (the transport device 300) and directs it to receive the article 2 of the transportation target from the storage 11 of the uppermost stage and deliver the article 2 to the designated delivery port 12. When the article 2 of the transportation target is in the storage 11 other than the uppermost stage, the crane 40 of the overhead stocker 100 transfers the article 2 of the transportation target to the storage 11 of the uppermost stage of the rack 10.

Subsequently, the upper overhead transport vehicle 60 travels along the first overhead track 20, stops at the lateral side of the storage 11 on which the article 2 of the transportation target is placed, lowers the second gripper 63 by the second lifting driver 64 after protruding the second lateral feeder 65, and grips the article 2 by the second gripper 63. Then, the upper overhead transport vehicle 60 raises the second gripper 63 by the second lifting driver 64, and then, by contracting the second lateral feeder 65, returns the second gripper 63 into the storage position, thereby accommodating the article 2 in the second body 62.

Subsequently, the upper overhead transport vehicle 60 travels along the first overhead track 20, holding the article 2 by the second gripper 63, and stops directly above the designated delivery port 12 (the detachable portion 14b). The upper overhead transport vehicle 60 then lowers the second gripper 63 and the article 2 by driving the second lifting driver 64 and releases the gripping of the second gripper 63 after placing the article 2 on the delivery port 12, thereby delivering the article 2 to the delivery port 12.

Next, the control device not depicted controls the overhead transport vehicle 50 of the overhead transport vehicle system 200 and directs it to receive the article 2 from the delivery port 12 and deliver the article 2 to the designated load port LP. The overhead transport vehicle 50 travels along the second overhead track 30, stops at the lateral side of the delivery port 12 on which the article 2 is placed, lowers the gripper 53 by the lifting driver 54 after protruding the lateral feeder 55, and grips the article 2 by the gripper 53. Thereafter, the overhead transport vehicle 50 raises the gripper 53 by the lifting driver 54, and then, by contracting the lateral feeder 55, returns the gripper 53 into the storage position, thereby accommodating the article 2 in the body 52.

Subsequently, the overhead transport vehicle 50 travels along the second overhead track 30, holding the article 2 by the gripper 53, and stops directly above the designated load port LP. Then, the overhead transport vehicle 50 lowers the gripper 53 and the article 2 by driving the lifting driver 54 and releases the gripping of the gripper 53 after placing the article 2 on the load port LP, thereby delivering the article 2 to the load port LP. By the above-described series of operations, the article 2 is transported from the storage 11 to the load port LP.

When transporting the article 2 from the load port LP of the processing apparatus TL to the storage 11 of the overhead stocker 100, by performing reverse operation of the above-described series of operations, the article 2 is transported from the load port LP of the processing apparatus TL to the storage 11 of the overhead stocker 100 via the delivery port 12. The same applies even when the transfer destination of the article 2 is other than the load port LP, and the same applies even when receiving the article 2 from other than the load port LP.

Figure 5:
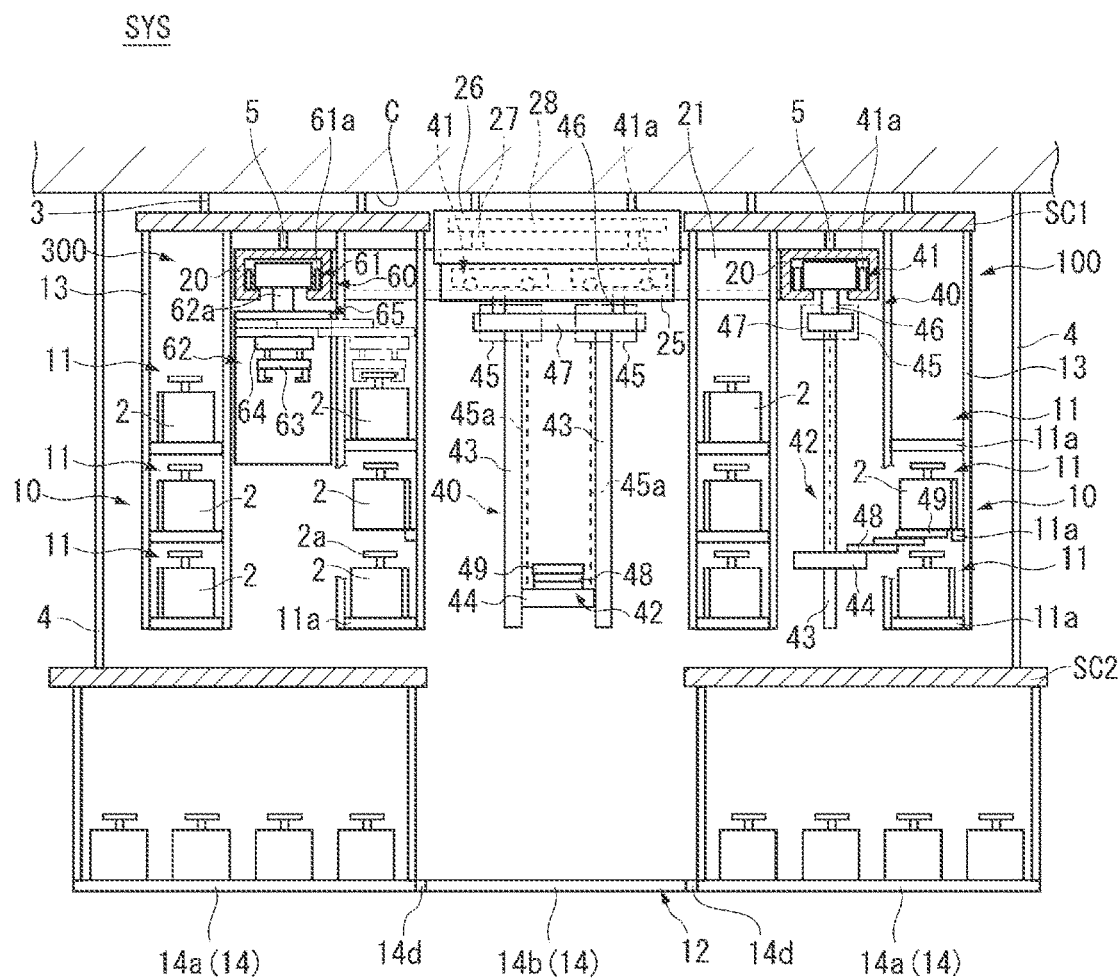
FIG. 5 illustrates one example of the operation of carrying out a crane and is a diagram illustrating a state in which the crane is arranged in the elevating track.
Figure 5:
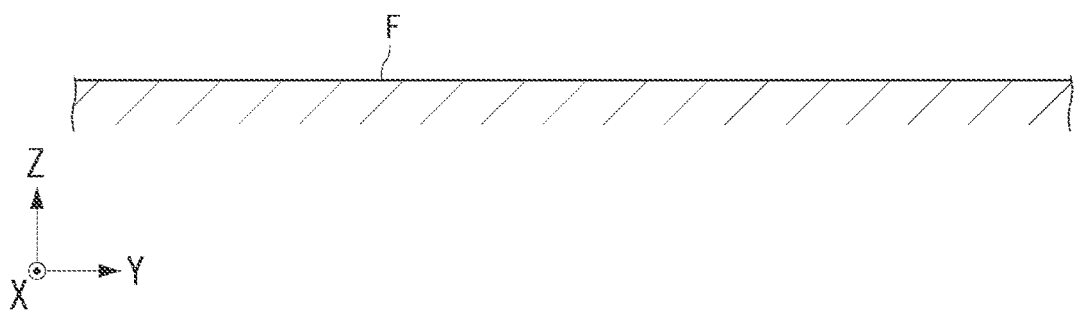

FIGS. 5 to 10 are diagrams illustrating one example of a carry-out operation of the crane 40 in the storage system SYS. When carrying out the crane 40 from the first overhead track 20, first, as illustrated in FIG. 5, the crane 40 serving as a carrying-out target is arranged on the elevating track 25. In this configuration, the crane 40 moves to a position where two travelers 41 are accommodated in the elevating track 25 and stops. The stop position of the crane 40 is controlled by the control device not depicted. The travelers 41 of the crane 40 may, to prevent the wheels 41a from rolling, lock the wheels 41a by brake devices not depicted or hold the wheels 41a at the stop position by traveling drivers not depicted. To prevent the article 2 from being placed on the detachable portion 14b directly below the elevating track 25, the article 2 on the detachable portion 14b is transported to the other placement portion 14 (the fixed portion 14a) or the storage 11 of the overhead stocker 100 by the overhead transport vehicle 50 or the upper overhead transport vehicle 60, in advance.

Figure 6:
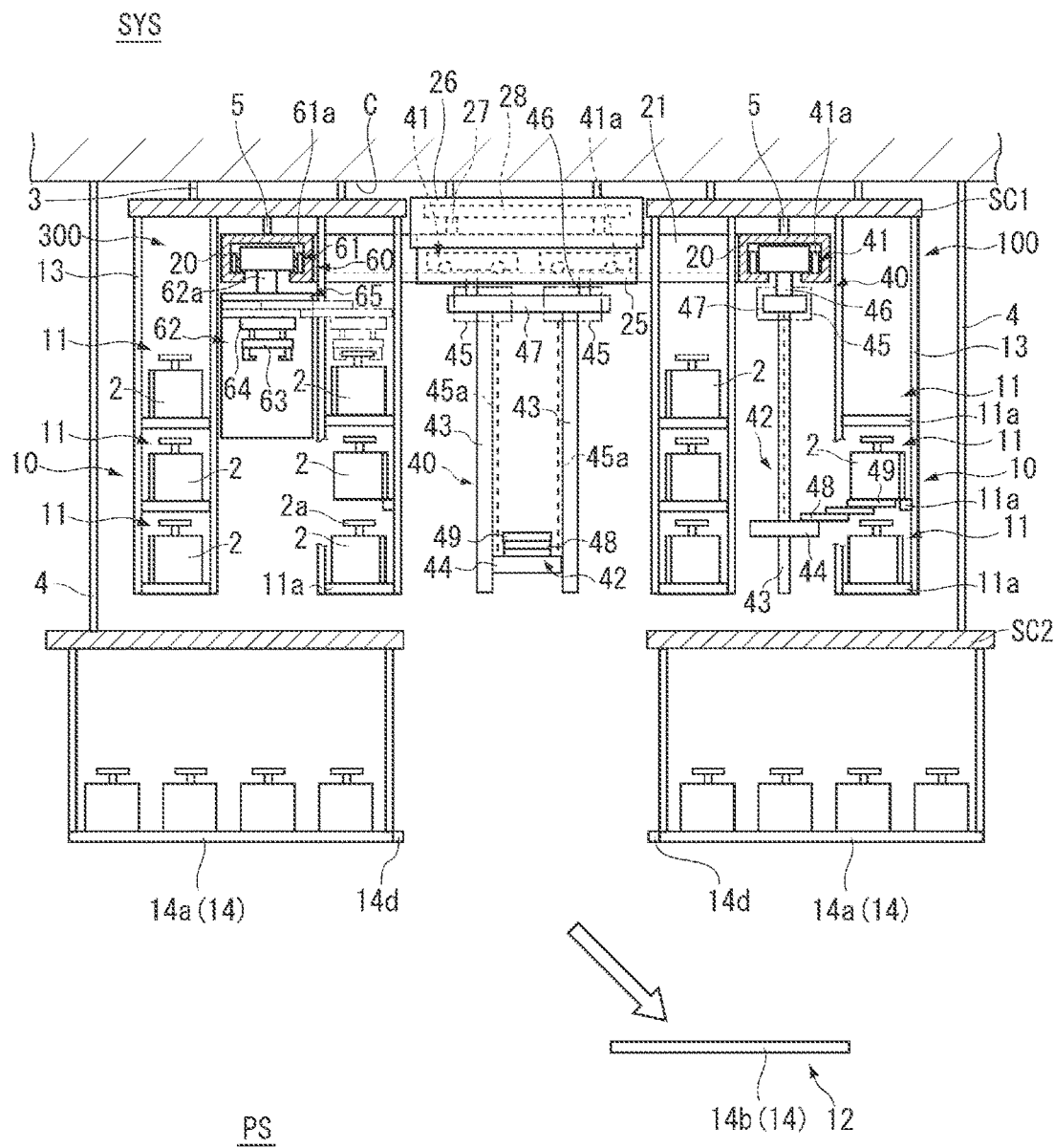
FIG. 6 is a diagram, following FIG. 5, illustrating a state in which a placement portion is retracted.

Next, as illustrated in FIG. 6, the detachable portion 14b is removed from between the fixed portions 14a and retracted from directly below the elevating track 25. In the removal work of the detachable portion 14b, a worker may release the coupling of the couplers 14d by manual work or, when the couplers 14d are electric coupling devices, the coupling may be released by driving the coupling devices, for example. The removed detachable portion 14b is transported to a predetermined storage location and temporarily stored therein. It may be in a configuration in which one of the couplers 14d on both sides is a hinge and, by releasing the coupling by the other of the couplers 14d and making the detachable portion 14b hung down from the hinge, the detachable portion 14b is retracted.

Figure 7:
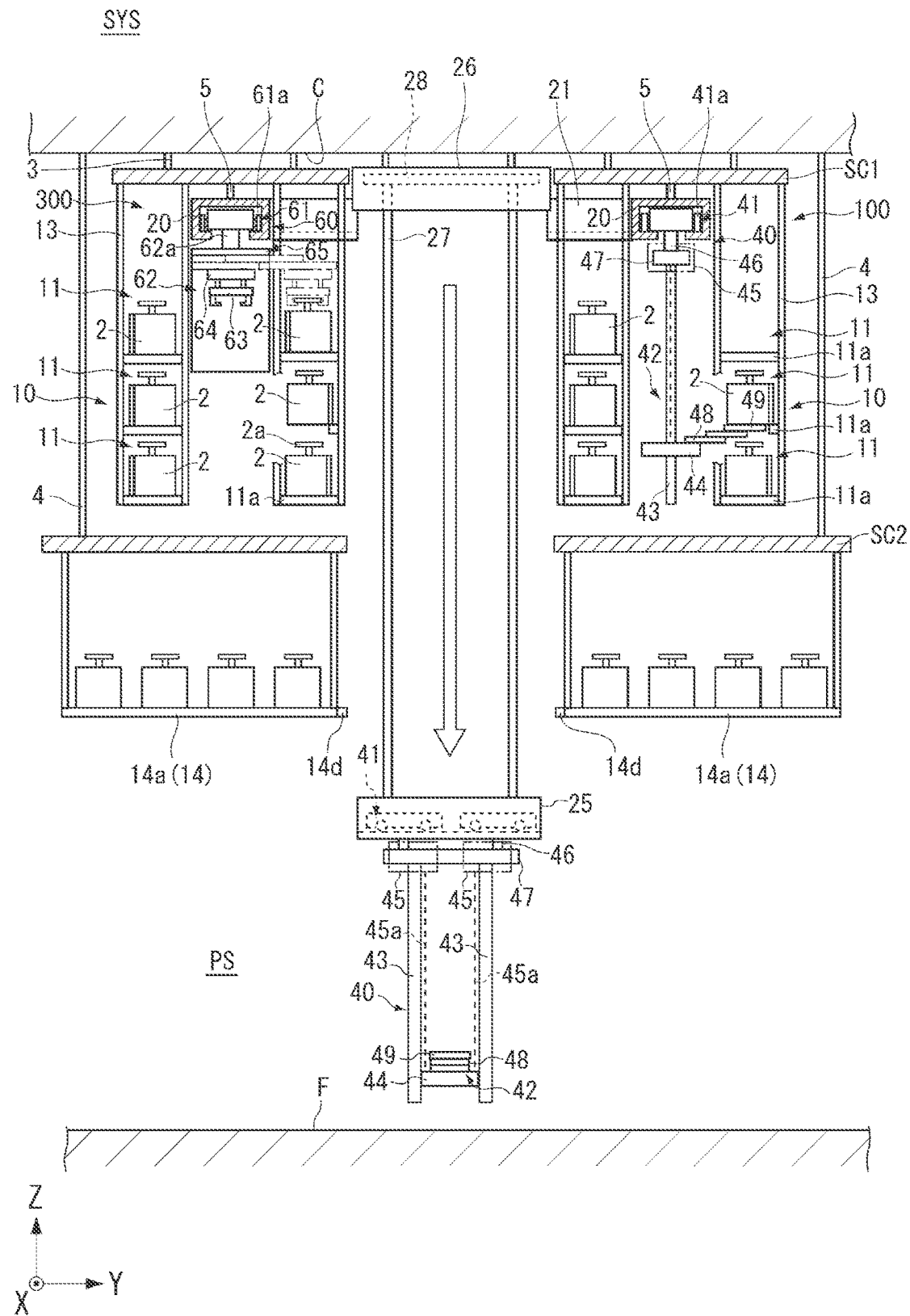
FIG. 7 is a diagram, following FIG. 6, illustrating a state in which the elevating track is lowered.

Next, as illustrated in FIG. 7, the suspending members 27 are fed out by driving the elevating track driver 28 so that the elevating track 25 is lowered while the crane 40 is still placed. Due to the descent of the elevating track 25, the elevating track 25 and the crane 40 pass through the gap of the opposing fixed portions 14a and, at a stage where the elevating track 25 has reached a predetermined height from the floor surface F, the driving of the elevating track driver 28 is stopped. The driving of the elevating track driver 28 may be controlled by the control device not depicted or may be performed by a worker by operating an operating portion. The predetermined height at which the elevating track 25 is stopped is a height that does not allow the lower end of the crane 40 to come in contact with the floor surface F. The predetermined height at which the elevating track 25 is stopped may be a height equal to the height of a transfer track 71 (see FIG. 8) of a crane transport carriage 70, which will be described later.

Figure 8:
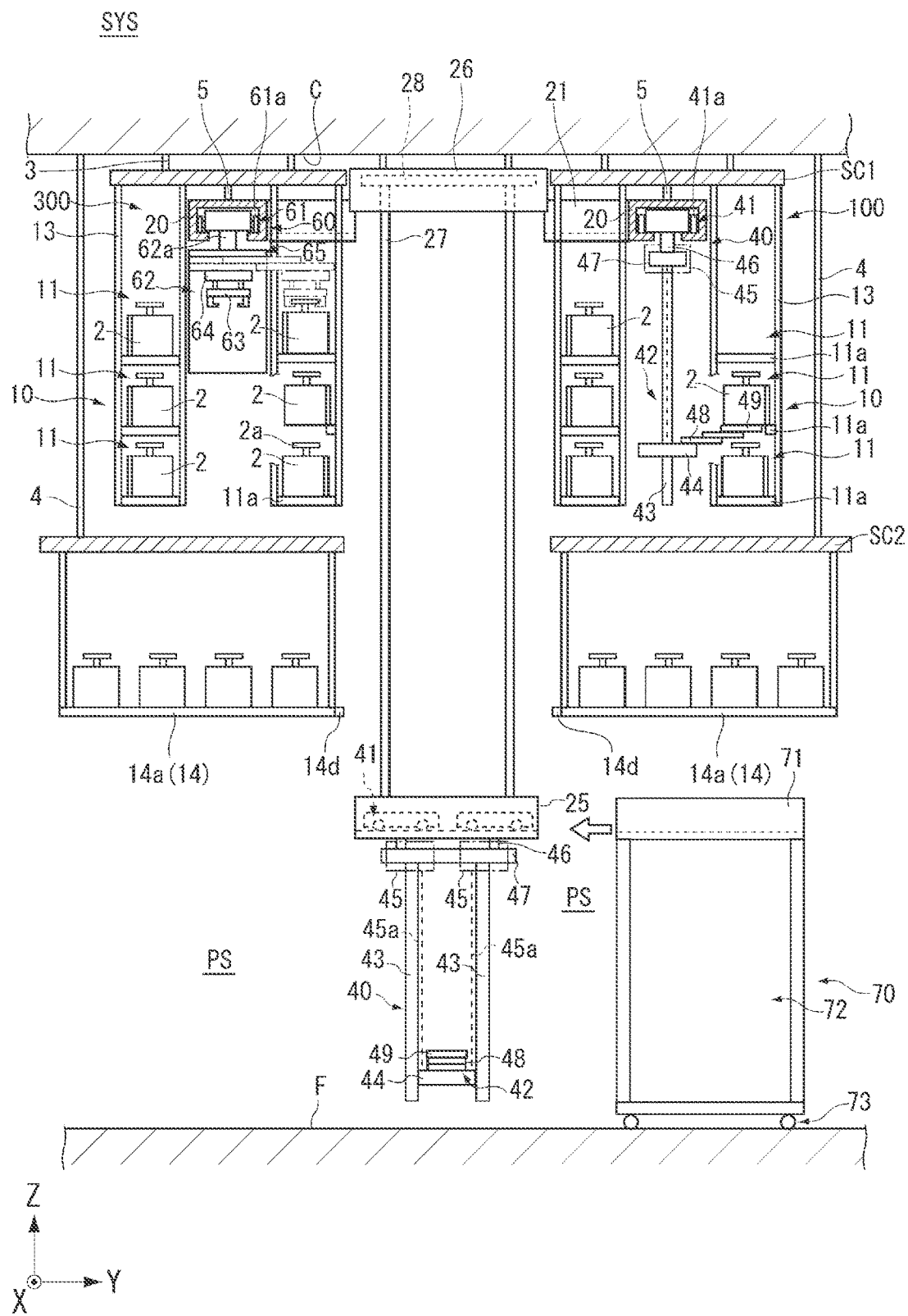
FIG. 8 is a diagram, following FIG. 7, illustrating a state in which a crane transport carriage connects to the elevating track.

Next, as illustrated in FIG. 8, the crane transport carriage 70 is arranged on one end portion side of the elevating track 25. The crane transport carriage 70 has the transfer track 71, a crane accommodating portion 72, and wheels 73. The transfer track 71 is a member having the same or substantially the same cross-sectional shape and size as those of the elevating track 25, for example. Accordingly, when the crane 40 is transferred onto the transfer track 71, the two travelers 41 of the crane 40 can be accommodated in the transfer track 71. The crane accommodating portion 72 is formed in a size capable of accommodating the transfer device 42 and the masts 43 of the crane 40. The wheels 73 are casters, for example, and move the crane transport carriage 70 on the floor surface F. At least one of the wheels 73 may be a drive wheel that rolls by receiving the drive by a drive source such as an electric motor.

Figure 9:
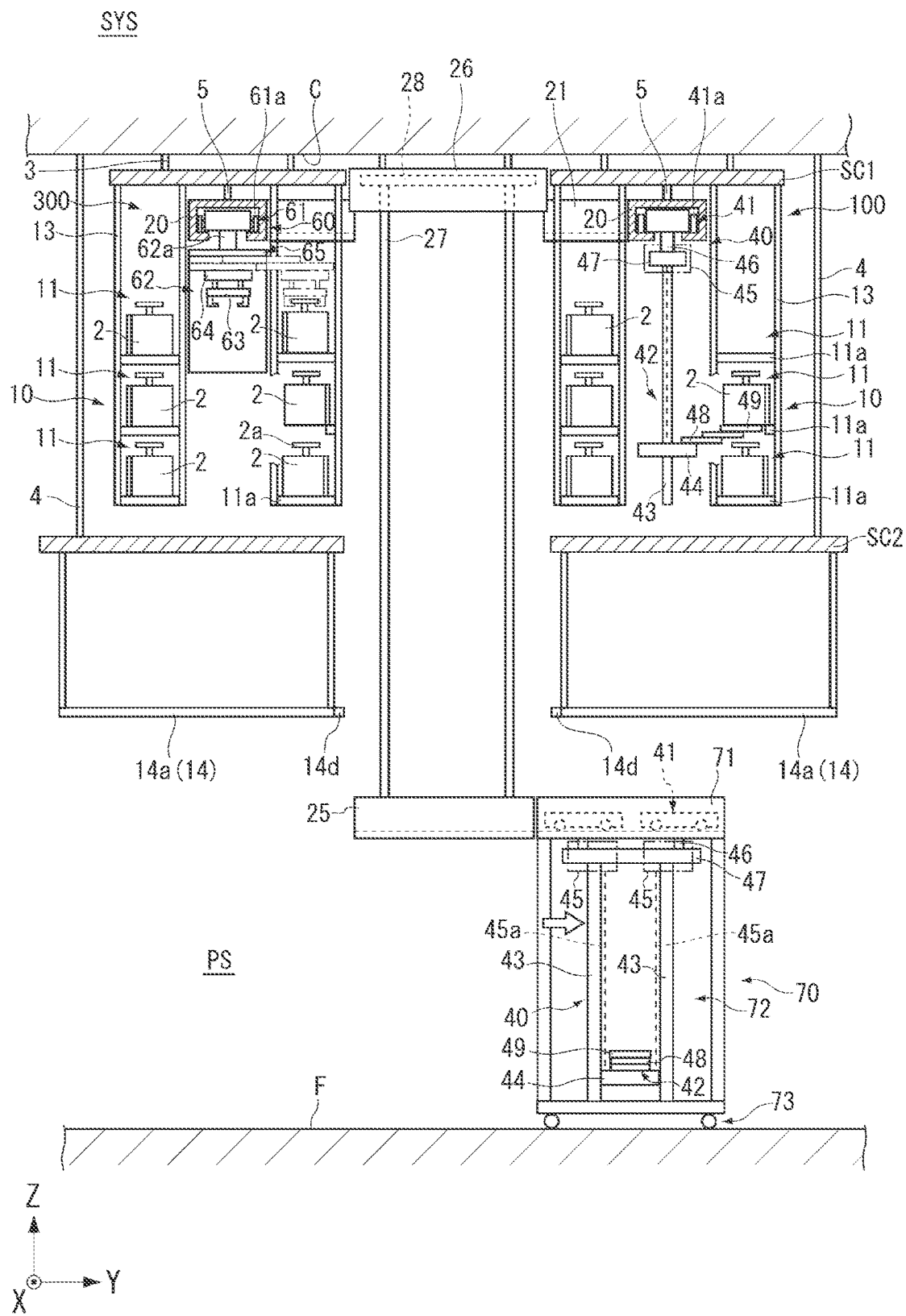
FIG. 9 is a diagram, following FIG. 8, illustrating a state in which the crane is transferred to the crane transport carriage.

After arranging the crane transport carriage 70 on one end portion side of the elevating track 25, the locks of the wheels 41a of the travelers 41 are released, and as illustrated in FIG. 9, the crane 40 is moved from the elevating track 25 to the transfer track 71 side. Because the elevating track 25 is arranged at the same height as that of the transfer track 71, the crane 40 can be smoothly moved from the elevating track 25 to the transfer track 71. To prevent the travelers 41 accommodated in the transfer track 71 from moving, a detent for the wheel 41a or a coupling tool to hold a part of the travelers 41 onto the transfer track 71 may be provided. Because the crane accommodating portion 72 is formed in a size capable of accommodating the masts 43, by merely moving the crane 40 to the transfer track 71, the masts 43 and the transfer device 42 are accommodated in the crane accommodating portion 72.

Figure 10:
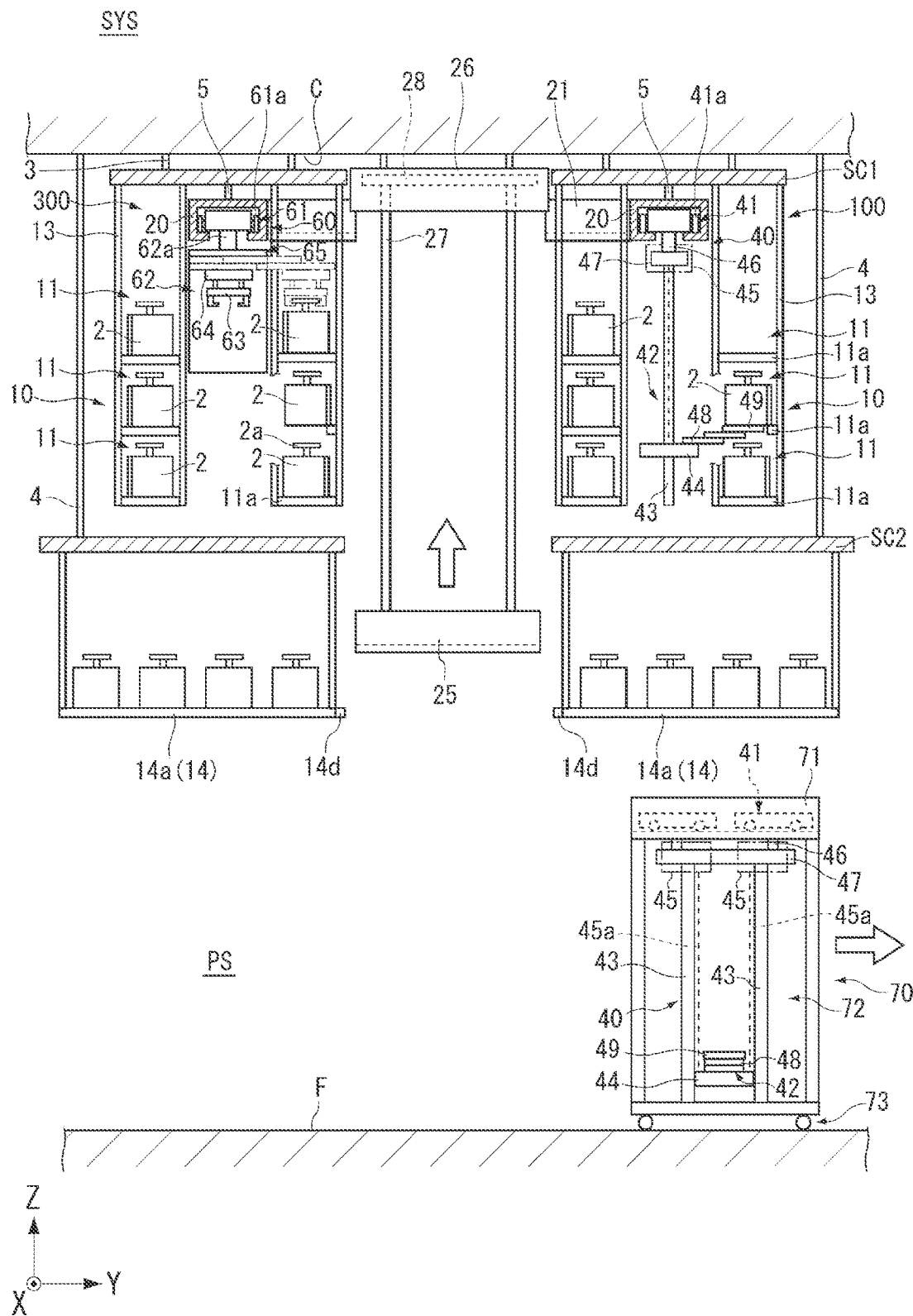
FIG. 10 is a diagram, following FIG. 9, illustrating a state of raising the elevating track.

After the crane 40 is accommodated in the crane transport carriage 70, as illustrated in FIG. 10, the crane transport carriage 70 is moved, by being pushed by the worker and the like, through the worker passage PS to a predetermined maintenance area, a storage facility or the like. The elevating track driver 28 winds the suspending member 27, thereby raising the elevating track 25. The elevating track 25 passes through the gap of the opposing fixed portions 14a and is arranged at the cutout portion of the linear portion 21 of the first overhead track 20. After arranging the elevating track 25 in the linear portion 21, by the worker or the like, the detachable portion 14b is attached between the fixed portions 14a. Through this series of operations, the crane 40 in the first overhead track 20 can be carried out.

When carrying in the crane 40 to the first overhead track 20, it is performed by the reverse operation of the above-described operations. First, the detachable portion 14b is removed from between the fixed portions 14a, and the elevating track 25 is lowered down to the above-described height. After the descent of the elevating track 25, the crane transport carriage 70 in which the crane 40 is accommodated is arranged on one end portion side of the elevating track 25, and the crane 40 is moved from transfer track 71 to the elevating track 25. After moving the crane 40 to the elevating track 25, the elevating track 25 is raised and the elevating track 25 is arranged in the linear portion 21. After arranging the elevating track 25 in the linear portion 21, the detachable portion 14b is attached between the fixed portions 14a.

As in the foregoing, according to the storage system SYS, the elevating track 25 that can be raised and lowered while having the crane 40 placed thereon is provided at a part of the first overhead track 20 and is arranged at a portion deviated from the second overhead track 30 in planar view so that there is no need to provide a dedicated track to carry out or carry in the crane 40 with respect to the first overhead track 20, and carrying out and carrying in of the crane 40 can be performed reliably and easily, without interfering with the overhead transport vehicle system 200.

Second Example

Figure 11:
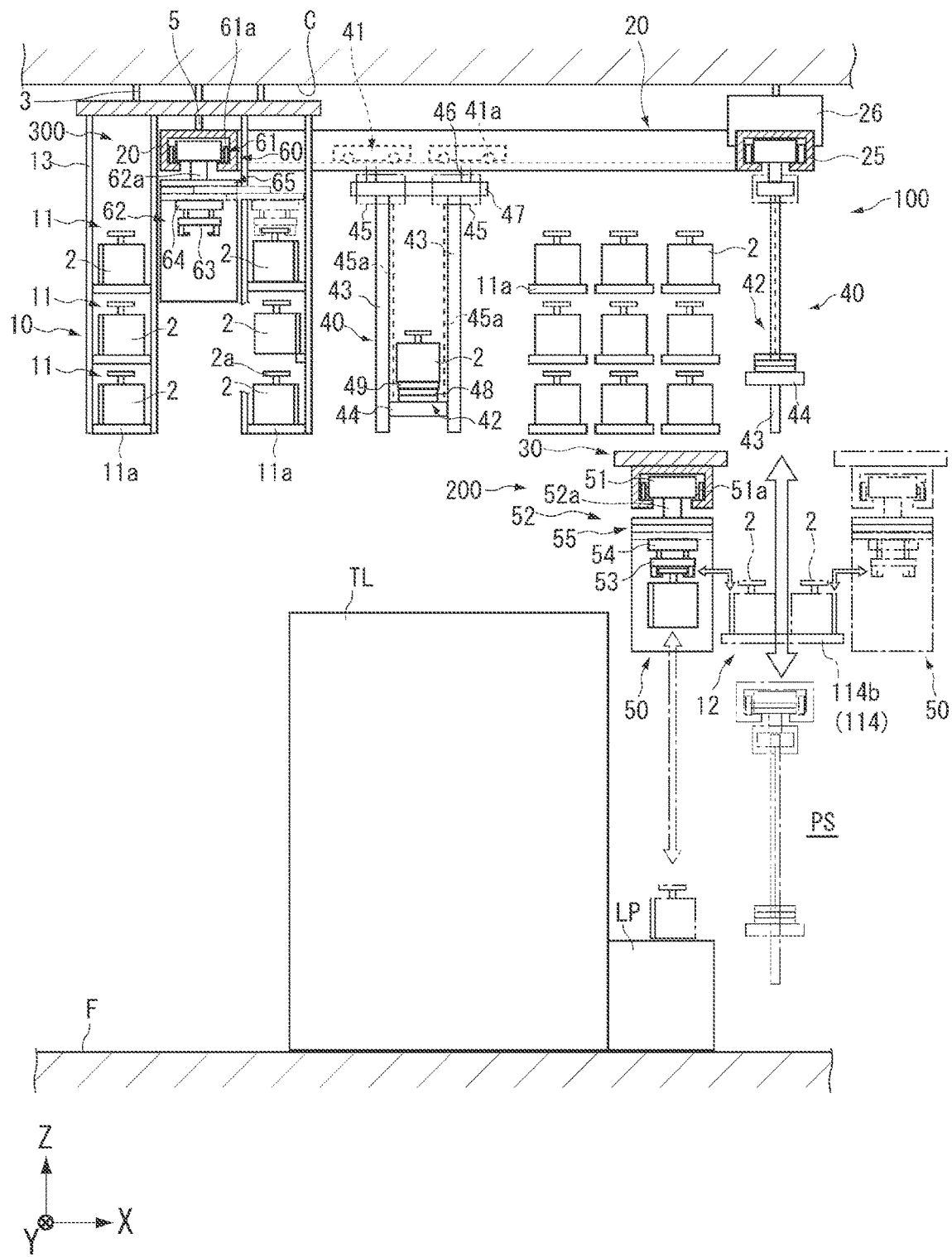
FIG. 11 is a diagram of a storage system according to a second example viewed from the Y direction.
Figure 12:
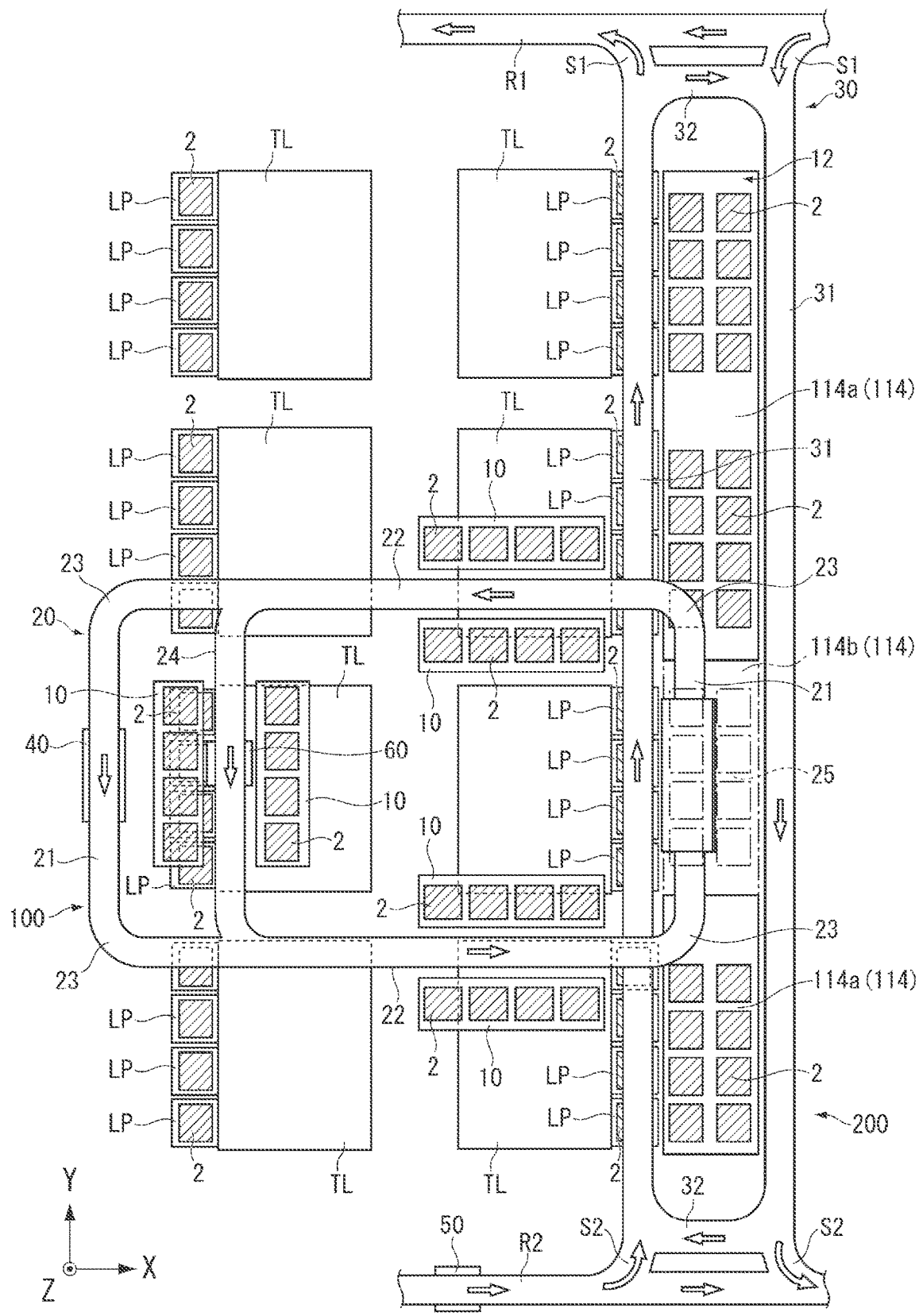
FIG. 12 is a diagram schematically illustrating the storage system illustrated in FIG. 11 in planar view.

In the above-described first example, the detachable portion 14b that is the delivery port 12 is in a configuration in which a plurality of articles 2 can be placed in a row along the Y direction, but this disclosure is not limited to this configuration. FIGS. 11 and 12 are diagrams illustrating one example of a storage system SYS2 according to a second example. FIG. 11 illustrates a side view, and FIG. 12 illustrates a plan view. In the following description, the configurations the same as or equivalent to those described in the above-described first example are denoted by the same reference signs, and the explanations thereof are either omitted or simplified.

As illustrated in FIGS. 11 and 12, the storage system SYS2 has a placement portion 114 on which the article 2 is placed. The placement portion 114 is, in planar view, arranged on the inner side of a circulating portion of the second overhead track 30 and is provided linearly along the Y direction. On the placement portion 114, a plurality of articles 2 can be placed in two rows along the X direction. In this configuration, for the row on the +X side of the placement portion 114, the delivery and receiving of the article 2 can be performed by the overhead transport vehicle 50 that travels the linear portion 31 arranged on the +X side of the placement portion 114. For the row on the −X side of the placement portion 114, the delivery and receiving of the article 2 can be performed by the overhead transport vehicle 50 that travels the linear portion 31 arranged on the −X side of the placement portion 114.

The placement portion 114 has fixed portions 114a and a detachable portion 114b, which is the delivery port 12. The fixed portions 114a and the detachable portion 114b are different from the first example in that the sizes thereof in the X direction are larger than those of the fixed portions 14a and the detachable portion 14b described in the first example, and the other configurations are the same as those of the first example. Also, the detachable portion 114b that is the delivery port 12 is ensured for two rows and more articles 2 than those of the detachable portion 14b of the first example can be placed. Thus, the number of the articles 2 delivered and received between the overhead stocker 100 and the overhead transport vehicle system 200 (the number of articles 2 placed on the delivery port 12) is increased so that the efficiency of transporting the articles 2 between the overhead stocker 100 and the overhead transport vehicle system 200 can be improved.

The overhead transport vehicle 50 laterally extends, for both rows on the +X side and the −X side of the placement portion 114, the lifting driver 54 to the +X side or the −X side by the lateral feeder 55 and arranges the gripper 53 directly above the row on the +X side or the row on the −X side so that the article 2 can be delivered and received to and from the detachable portion 114b. The placement portion 114 may be arranged so that, on either one of the row on the +X side and the row on the −X side, the article 2 can be delivered and received by raising and lowering the gripper 53 without performing the lateral extension by the lateral feeder 55.

In the storage system SYS2, when carrying out the crane 40 from the first overhead track 20, as with the first example, the crane 40 is arranged in the elevating track 25, the detachable portion 114b is removed from between the fixed portions 114a, and the elevating track 25 is lowered supporting the crane 40 that has stopped traveling. The crane 40 is moved from the lowered elevating track 25 to the transfer track 71 of the crane transport carriage 70 (see FIG. 5 and others), and the crane 40 is transferred to another place by the crane transport carriage 70. After raising the elevating track 25 and arranging in the linear portion 21, the detachable portion 114b is attached between the fixed portions 114a. Through this series of operations, the crane 40 in the first overhead track 20 can be carried out.

When carrying in the crane 40 to the first overhead track 20, it is performed by the reverse operation of the above-described operations. First, the detachable portion 114b is removed from between the fixed portions 114a, and the elevating track 25 is lowered. After the descent of the elevating track 25, the crane 40 is moved from the transfer track 71 of the crane transport carriage 70 to the elevating track 25. After moving the crane 40 to the elevating track 25, the elevating track 25 is raised and the elevating track 25 is arranged in the linear portion 21. After arranging the elevating track 25 in the linear portion 21, the detachable portion 114b is attached between the fixed portions 114a.

As in the foregoing, according to the storage system SYS2, as with the above-described storage system SYS, there is no need to provide a dedicated track to carry out or carry in the crane 40 from or to the first overhead track 20 so that carrying out and carrying in of the crane 40 can be performed reliably and easily, without interfering with the overhead transport vehicle system 200. In addition, the number of the articles 2 that can be placed on the delivery port 12 (the detachable portion 114b) is increased so that the efficiency of transporting the articles 2 between the overhead stocker 100 and the overhead transport vehicle system 200 can be improved and the transportation efficiency of the articles 2 as the entire system can be improved.

As in the foregoing, the examples have been described, but our storage systems are not limited to the foregoing description, and various modifications are possible within a scope not departing from this disclosure. For example, in the above-described examples, in the storage systems SYS and SYS2, a configuration in which the first overhead track 20 and the second overhead track 30 are not connected has been described as an example, but the example is not limited to this configuration. For example, the first overhead track 20 and the second overhead track 30 may be connected via a connecting track and the like.

In the above-described examples, in the storage systems SYS and SYS2, a configuration in which the racks 10, the first overhead track 20, and the second overhead track 30 are suspended from the ceiling C or the system ceilings SC1 and SC2 has been described as an example, but the example is not limited to this configuration. For example, it may be a configuration in which at least one of the racks 10, the first overhead track 20, and the second overhead track 30 is supported by a column, a frame, a pedestal or the like provided on the floor surface F so that the floor surface F bears the load of the racks 10 and the like.

One or more of the prerequisites described in the above-described examples and the like may be omitted. The prerequisites described in the above-described examples and the like can be combined as appropriate. The disclosure of Japanese Patent Application No. 2019-011280 and all the documents cited in the above-described examples and the like will be incorporated as a part of this disclosure.

The invention claimed is:

1. A storage system comprising:
an overhead stocker having a first overhead track, a rack including a plurality of storages arranged vertically, and a crane that travels along the first overhead track and delivers and receives an article to and from the storages; and
an overhead transport vehicle system having a second overhead track provided below a lower end of the overhead stocker, and an overhead transport vehicle that travels along the second overhead track and delivers and receives an article to and from a predetermined transfer destination, wherein
the first overhead track has an elevating track capable of supporting and lowering the crane that is stopped traveling at a portion deviated from the second overhead track in planar view.

2. The storage system according to claim 1, wherein the elevating track is provided directly above a worker passage.

3. The storage system according to claim 1, further comprising:
a suspending member that suspends and holds the elevating track, and
an elevating track driver that raises and lowers the elevating track by winding or feeding out the suspending member.

4. The storage system according to claim 1, further comprising:
a transport device that transports an article vertically between the overhead stocker and the overhead transport vehicle system, and
a placement portion provided directly below the elevating track that allows both the overhead transport vehicle and the transport device to deliver and receive an article, wherein
the placement portion is retractable from directly below the elevating track.

5. The storage system according to claim 4, wherein
the placement portion is bridged between a pair of other placement portions, and
the overhead transport vehicle delivers and receives an article to and from the other placement portions.

* * * * *